United States Patent
Korodi et al.

(10) Patent No.: US 8,730,071 B2
(45) Date of Patent: May 20, 2014

(54) METHODS AND DEVICES FOR LOAD BALANCING IN PARALLEL ENTROPY CODING AND DECODING

(75) Inventors: Gergely Ferenc Korodi, Waterloo (CA); Dake He, Waterloo (CA); En-hui Yang, Waterloo (CA); Gaelle Christine Martin-Cocher, Toronto (CA)

(73) Assignee: Blackberry Limited, Waterloo, Ontario (CA)

( * ) Notice: Subject to any disclaimer, the term of this patent is extended or adjusted under 35 U.S.C. 154(b) by 217 days.

(21) Appl. No.: 13/438,867

(22) Filed: Apr. 4, 2012

(65) Prior Publication Data

US 2012/0194363 A1 Aug. 2, 2012

Related U.S. Application Data

(63) Continuation of application No. 12/758,905, filed on Apr. 13, 2010, now Pat. No. 8,174,414.

(51) Int. Cl.
*H03M 7/00* (2006.01)
*H03M 7/40* (2006.01)

(52) U.S. Cl.
CPC .................... *H03M 7/40* (2013.01)
USPC ............................ 341/107; 341/87

(58) Field of Classification Search
CPC ............................ H03M 7/40; H03M 7/4006
USPC .................................... 341/87, 107
See application file for complete search history.

(56) References Cited

U.S. PATENT DOCUMENTS

| | | | |
|---|---|---|---|
| 5,381,145 A | 1/1995 | Allen | |
| 5,471,206 A * | 11/1995 | Allen et al. | 341/51 |
| 5,717,394 A * | 2/1998 | Schwartz et al. | 341/51 |
| 8,520,958 B2 * | 8/2013 | Singh et al. | 382/234 |
| 2009/0245349 A1 | 10/2009 | Zhao et al. | |
| 2009/0279613 A1 | 11/2009 | Suzumura | |

FOREIGN PATENT DOCUMENTS

| | | |
|---|---|---|
| WO | 2009/157043 | 12/2009 |
| WO | 2008/053755 | 8/2010 |

OTHER PUBLICATIONS

Sze et al., "A High Throughput CABAC Algorithm Using Syntax Element Partitioning", 16th IEEE International Conference on Image Processing (ICIP), pp. 773-776, 2009.

He et al., "Video Coding Technology Proposal by RIM" (JCTVC-A120), Proposal for the Joint Collaborative Team on Video Coding (JCT-VC) of ITU-T SG16 WP3 and ISO/IEC JTC1/SC29/WG11, Dresden, Germany, Apr. 15-23, 2010.

"Algorithm and VLSI Architecture of a Parallel Arithmetic Entropy Coder for Parallel H.264 Video Encoder", Chen et al., Proceedings of the International Symposium on Signals, Systems and Electronics (ISSSE), Sep. 17-20, 2010.

(Continued)

*Primary Examiner* — Khai M Nguyen
(74) *Attorney, Agent, or Firm* — Rowand LLP

(57) ABSTRACT

Devices and methods for entropy decoding a bitstream of encoded data by extracting a plurality of encoded subsequences from a payload field of the bitstream for parallel decoding on a set of parallel entropy decoders. The method includes dividing the payload of concatenated encoded subsequences into segments using a distribution function and distributing the segments amongst the set of parallel entropy decoders to balance the computational load among the parallel entropy decoders. The received bitstream includes auxiliary information inserted by the encoder to enable the decoder to entropy decode segments that begin with a portion of an encoded subsequence.

20 Claims, 13 Drawing Sheets

(56) References Cited

OTHER PUBLICATIONS

International Search Report dated Jun. 20, 2011, PCT/CA2011/050197.

Boliek M et al: "Very high speed entropy coding" Proceedings of the International Conference on Image Processing (ICIP) Austin, Nov. 13-16, 1994; [Proceedings of the International Conference on Image Processing (ICIP)], Los Alamitos, IEEE Comp. Soc. Press, US LNKD DO1:10.1109/ICIP.1994.413814.

Mastronarde N H et al: "A Bargaining Theoretic Approach to Quality-Fair System Resource Allocation for Multiple Decoding Tasks" IEEE Transactions on Circuits and Systems for Video Technology, IEEE Service Center, Piscataway, NJ, US,. vol. 18, No. 4, Apr. 1, 2008, pp. 453-466, XP011204010.

European Search Report dated Aug. 12, 2010.

ITU-T Recommendation H-264/ISO/IEC 14496-10 AVC, Advanced video coding for general audiovisual services, Nov. 2007.

http://iphome.hhi.de/suehring/tml/ H.264/AVC reference software, available online http://iphome.hhi.de/surhring/tml/.

Vivienne Sze, Anantha P. Chandrakasan, Madhukar Budagavi, Minhua Zhou: Parallel CABAC for low power video coding. ICIP 2008: 2096-2099. Available under http://www-video.eecs.berkeley.edu/Proceedings/ICIP2008/pdfs/0002096.pdf.

Chung-Hyo Kim and In-Cheol Park, "Parallel Decoding of Context-based Adaptive Binary Arithmetic Codes Based on Most Probable Symbol Prediction", IEICE Trans. Inf. & Syst., Voi.E90?D, No. 2 Feb. 2007. p. 609. Available under http:I/ics.kaist.ac.kr/ver3.0/intjpapers/Parallei%20Decoding%20of%20Context-based%20Adaptive%20Binary%20Arithmetic%20Codes%20Based%20Based%20on%20Most%20Probable%20Symboi%20Prediction.pdf.

\* cited by examiner

METHODS AND DEVICES FOR LOAD BALANCING IN PARALLEL ENTROPY CODING AND DECODING

CROSS-REFERENCE TO RELATED APPLICATIONS

The present application is a continuation of U.S. patent application Ser. No. 12/758,905, filed Apr. 13, 2010, and owned in common herewith, the contents of which is hereby incorporated by reference.

FIELD

The present application generally relates to data compression and, in particular, to an encoder, a decoder and methods of entropy coding and decoding finite alphabet sources.

BACKGROUND

Data compression, whether lossy or lossless, often uses entropy coding to encode a decorrelated signal as a sequence of bits, i.e. a bitstream. Efficient data compression has a wide range of applications, such as image, audio, and video encoding. The current state-of-the-art for video encoding is the ITU-T H.264/MPEG AVC video coding standard. It defines a number of different profiles for different applications, including the Main profile, Baseline profile and others.

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding. In any of these cases, the coding scheme operates upon the binary data to produce a serial bitstream of encoded data. At the decoder, the decoding scheme receives the bitstream and entropy decodes the serial bitstream to reconstruct the binary data.

It would be advantageous to provide for an improved encoder, decoder and method of entropy coding.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
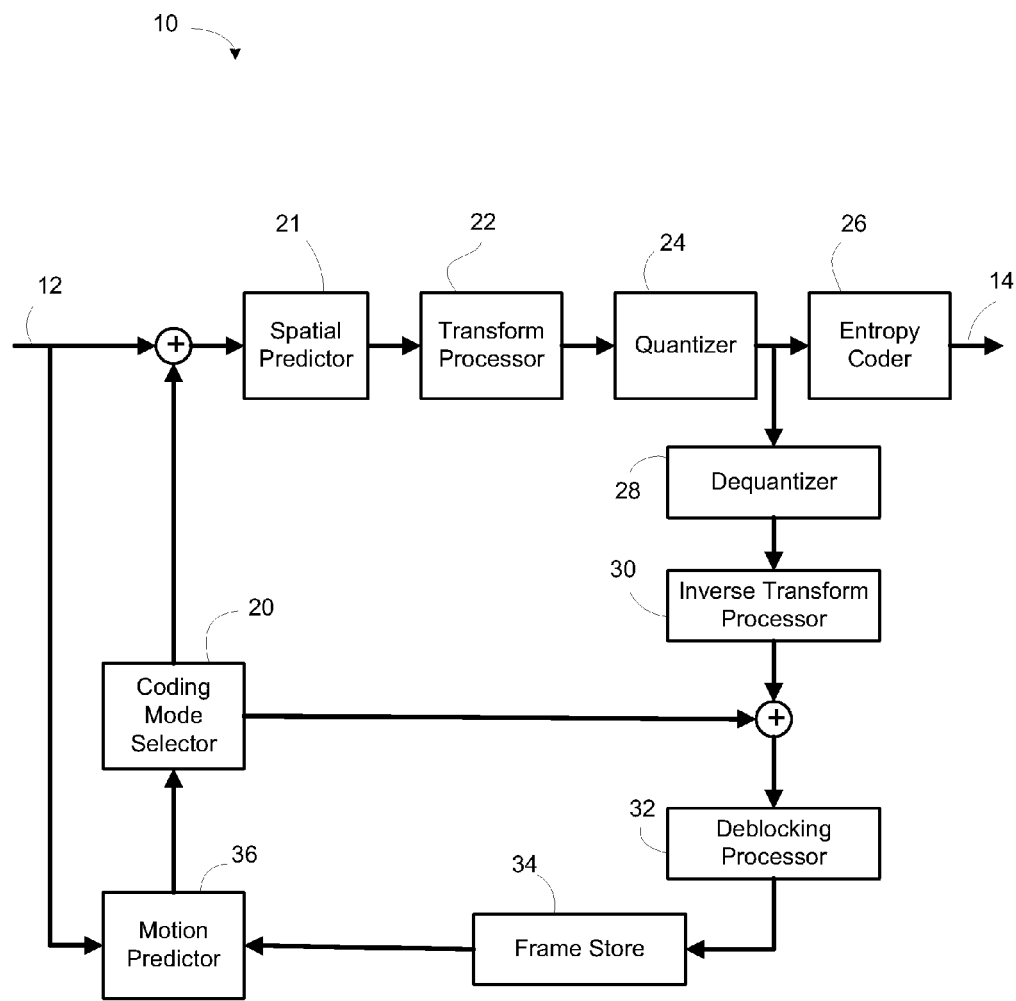
FIG. 1 shows, in block diagram form, an encoder for encoding video.

The present application describes architectures, methods and processes for encoding and decoding data. In particular, the application describes a method for entropy coding data using parallel entropy coders to encode an input sequence into a plurality of encoded subsequences, which are then combined to form an output bitstream. The application further describes a method for entropy decoding encoded data by extracting a plurality of encoded subsequences from an input bitstream and parallel entropy decoding the encoded subsequences to generate a plurality of decoded subsequences, which are then interleaved based on a context model to produce a reconstructed sequence.

The present application further describes processes, methods, encoders and decoders for load balancing at the decoder. A decoder that has a plurality of parallel entropy decoders can perform load balancing to ensure each of the entropy decoder shares a proportional amount of the computational decoding burden. The division of concatenated encoded subsequences from the payload of the bitstream into segments for allocation amongst the parallel entropy decoder can result in splitting one or more of the encoded subsequences. To enable an entropy decoder to begin decoding a later portion of the encoded subsequence without first decoding an earlier portion, the bitstream includes auxiliary information to enable the decoding to begin.

In one aspect, the present application describes a method of decoding a bitstream at a decoder having two or more parallel entropy decoders, the bitstream having a payload of concatenated encoded subsequences. The method includes extracting length data for the encoded subsequences from the bitstream; partitioning the payload into a plurality of segments for parallel decoding, wherein the partitioning divides at least one of the encoded subsequences into a first part within one of the plurality of segments and a second part within another of the plurality of segments; reading auxiliary information from the bitstream; and decoding the plurality of segments using the two or more parallel entropy decoders, wherein the auxiliary information enables decoding of the second part without first decoding the first part.

In a further aspect, the present application describes a method for encoding multiple sources to generate a bitstream. The method includes encoding the multiple sources in parallel to generate encoded subsequences; calculating a partition of the concatenated encoded subsequences into a plurality of segments, wherein the partition would divide at least one of the encoded subsequences into a first part within one of the plurality of segments and a second part within another of the plurality of segments; determining auxiliary information required by a decoder to enable the decoder to decode the second part without first decoding the first part; and outputting the bitstream, wherein the bitstream includes the concatenated encoded subsequences and the auxiliary information.

In another aspect, the present application describes an encoder. The encoder includes a processor; memory; and an encoding application stored in memory and containing instructions for configuring the processor to encode the input sequence in accordance with the method described above.

In yet a further aspect, the present application describes a decoder having a plurality of parallel entropy decoders. The decoder includes a processor; memory; and a decoding application stored in memory and containing instructions for configuring the processor to decode the bitstream in accordance with the method described above.

In another aspect, the present application describes a method of decoding a bitstream at a decoder, the bitstream including concatenated encoded subsequences, wherein each of the encoded subsequences is associated with a respective estimated probability defined by a context model. The method includes partitioning the concatenated encoded subsequences into a plurality of segments, wherein the partitioning divides at least one of the encoded subsequences into a first part within one of the plurality of segments and a second part within another of the plurality of segments; extracting auxiliary information from the bitstream; and decoding the plurality of segments, wherein the auxiliary information enables decoding of the second part without first decoding the first part.

In a further aspect, the present application describes a decoder for decoding a bitstream, the bitstream including concatenated encoded subsequences, wherein each of the encoded subsequences is associated with a respective estimated probability defined by a context model. The decoder includes a processor; a memory; and a decoding application stored in memory and containing instructions for configuring the processor to partition the concatenated encoded subsequences into a plurality of segments, wherein the partitioning divides at least one of the encoded subsequences into a first part within one of the plurality of segments and a second part within another of the plurality of segments; extract auxiliary information from the bitstream; and decode the plurality of segments, wherein the auxiliary information enables decoding of the second part without first decoding the first part.

Other aspects and features of the present application will be understood by those of ordinary skill in the art from a review of the following description of examples in conjunction with the accompanying figures.

The present application details methods, encoders and decoders for parallel entropy encoding and decoding. Various methods, encoders and decoders are described in U.S. patent application Ser. No. 12/707,797 filed Feb. 18, 2010, and owned in common herewith, the contents of which are hereby incorporated by reference. Portions of the description within U.S. patent application Ser. No. 12/707,797 are repeated below, following which the present application details methods, encoders and decoders for load balancing in the context of parallel entropy encoding and decoding.

The following description relates to data compression in general and, in particular, to the efficient parallel encoding of finite alphabet sources, such as a binary source. In many of the examples given below, particular applications of such an encoding and decoding scheme are given. For example, many of the illustrations below make reference to video coding. It will be appreciated that the present application is not limited to video coding or image coding.

In the description that follows, example embodiments are described with reference to the H.264 standard. Those ordinarily skilled in the art will understand that the present application is not limited to H.264 but may be applicable to other video coding/decoding standards. It will also be appreciated that the present application is not necessarily limited to video coding/decoding and may be applicable to coding/decoding of any binary sources.

In the description that follows, in the context of video applications the terms frame and slice are used somewhat interchangeably. Those of skill in the art will appreciate that, in the case of the H.264 standard, a frame may contain one or more slices. It will also be appreciated that certain encoding/decoding operations are performed on a frame-by-frame basis and some are performed on a slice-by-slice basis, depending on the particular requirements of the applicable video coding standard. In any particular embodiment, the applicable video coding standard may determine whether the operations described below are performed in connection with frames and/or slices, as the case may be. Accordingly, those ordinarily skilled in the art will understand, in light of the present disclosure, whether particular operations or processes described herein and particular references to frames, slices, or both are applicable to frames, slices, or both for a given embodiment.

Figure 2:
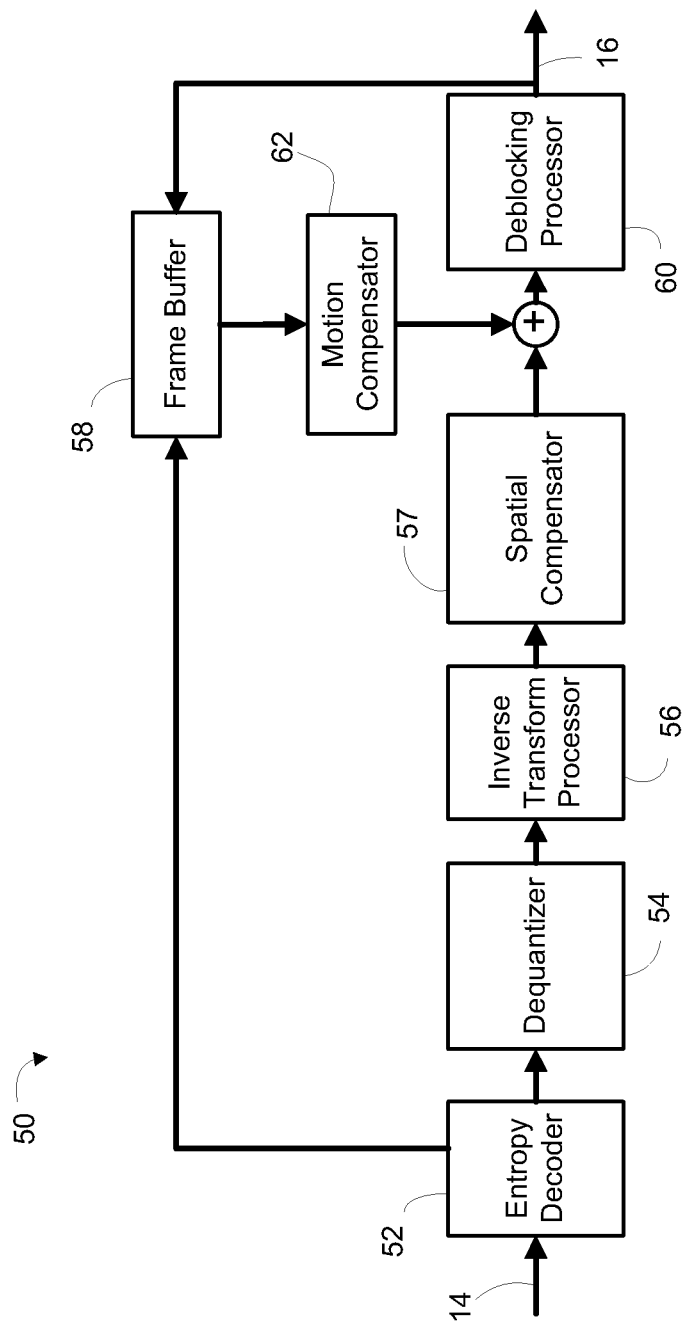
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard.

The encoder 10 includes a spatial predictor 21, a coding mode selector 20, transform processor 22, quantizer 24, and entropy coder 26. As will be appreciated by those ordinarily skilled in the art, the coding mode selector 20 determines the appropriate coding mode for the video source, for example whether the subject frame/slice is of I, P, or B type, and whether particular macroblocks within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. Applying the block-based transform to a block of pixel data results in a set of transform domain coefficients. The set of transform domain coefficients is quantized by the quantizer 24. The quantized coefficients and associated information, such as motion vectors, quantization parameters, etc., are then encoded by the entropy coder 26.

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements minor the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks to which motion prediction is applied, the "source data" which the transform processor 22 encodes is the residual data that comes out of the motion prediction process. The residual data is pixel data that represents the differences (if any) between the reference block and the current block. Information regarding the reference frame and/or motion vector may not be processed by the transform processor 22 and/or quantizer 24, but instead may be supplied to the entropy coder 26 for encoding as part of the bitstream along with the quantized coefficients.

Those ordinarily skilled in the art will appreciate the details and possible variations for implementing H.264 encoders.

The decoder 50 includes an entropy decoder 52, dequantizer 54, inverse transform processor 56, spatial compensator 57, and deblocking processor 60. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock, the recreated "video data" is the residual data for use in spatial compensation relative to a previously decoded block within the frame. The spatial compensator 57 generates the video data from the residual data and pixel data from a previously decoded block. In other cases, such as inter-coded macroblocks, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock. It does so based on the reference frame information and motion vector specified for the inter-coded macroblock. It then supplies the reference block pixel data for combination with the residual data to arrive at the recreated video data for that macroblock.

A deblocking process may then be applied to a reconstructed frame/slice, as indicated by the deblocking processor 60. After deblocking, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

A common challenge for both of these encoding approaches is that they are inherently serial in nature. In some important practical applications, such as high-quality video decoding, the entropy decoder has to reach very high output speed, which can pose a problem for devices with limited processing power or speed.

One of the techniques used in some entropy coding schemes, such as CAVLC and CABAC, both of which are used in H.264/AVC, is context modeling. With context modeling, each bit of the input sequence has a context, where the context is given by the bits that preceded it. In a first-order context model, the context may depend entirely upon the previous bit (symbol). In many cases, the context models may be adaptive, such that the probabilities associated with symbols for a given context may change as further bits of the sequence are processed.

Figure 3:
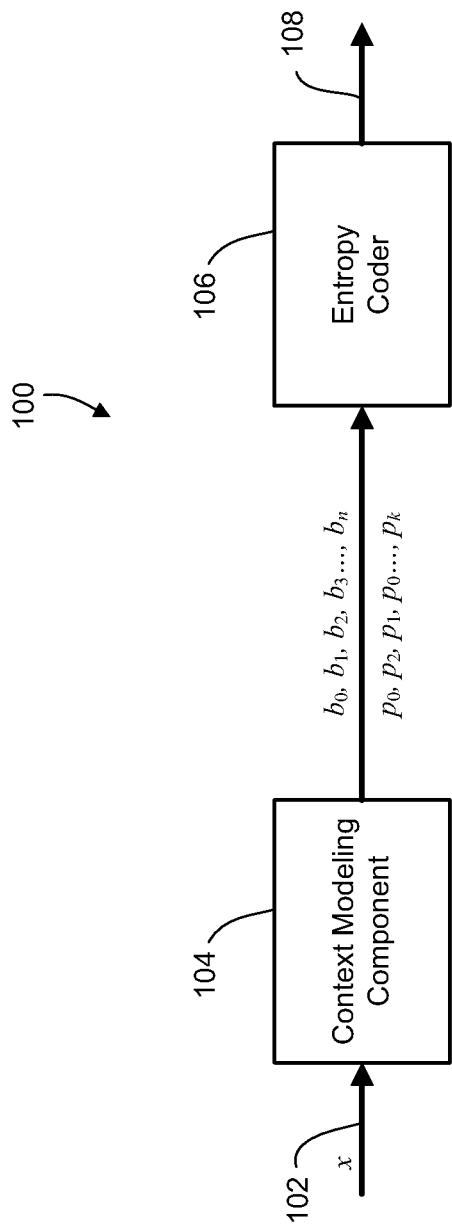
FIG. 3 shows a block diagram of an encoding process.

Reference is made to FIG. 3, which shows a block diagram of an encoding process 100. The encoding process 100 includes a context modeling component 104 and an entropy coder 108. The context modeling component 104 receives the input sequence x 102, which in this example is a bit sequence $(b_0, b_1, \ldots, b_n)$. The context modeling component 104 determines a context for each bit $b_i$ based on one or more previous bits in the sequence, and determines, based on the adaptive context model, a probability $p_i$ associated with that bit $b_i$ where the probability is the probability that the bit will be the Least Probable Symbol (LPS). The LPS may be "0" or "1" in a binary embodiment, depending on the convention or application. The context modeling component outputs the input sequence, i.e. the bits $(b_0, b_1, \ldots, b_n)$ along with their respective probabilities $(p_0, p_1, \ldots, p_n)$. The probabilities are an estimated probability determined by the context model. This data is then input to the entropy coder 106, which encodes the input sequence using the probability information. For example, the entropy coder 106 may be a binary arithmetic coder. The entropy coder 106 outputs a bitstream 108 of encoded data.

It will be appreciated each bit of the input sequence is processed serially to update the context model, and the serial bits and probability information are supplied to the entropy coder 106, which then serially entropy codes the bits to create the bitstream 108. Those ordinarily skilled in the art will appreciate that, in some embodiments, explicit probability information may not be passed from the context modeling component 104 to the entropy coder 106; rather, in some instances, for each bit the context modeling component 104 may send the entropy coder 106 an index or other indicator that reflects the probability estimation made be the context modeling component 104 based on the context model and the current context of the input sequence 102. The index or other indicator is indicative of the probability estimate associated with its corresponding bit.

In accordance with one aspect, the present application proposes an encoder and decoder having a parallel processing architecture for entropy coding and decoding. The architecture includes a context modeling component which, for each bit of the input sequence, determines an estimated probability based on the context model. The context modeling component assigns each bit to one of N "sources" based on its estimated probability. In this manner, each of the N sources builds up a subsequence of bits assigned to it. Each of the N subsequences is then entropy coded by its own entropy encoder in parallel to generate a bitstream. The N bitstreams are then combined to form a single bitstream. Indexing data is added to the single bitstream to enable the decoder to demultiplex the single bitstream into the N bitstreams.

At the decoder, the signal bitstream is demultiplexed to obtain the N bitstreams, which are then entropy decoded in parallel to recover the N subsequences. The bits of the N subsequences are then interleaved in accordance with the context model to reconstruct the input sequence.

Figure 4:
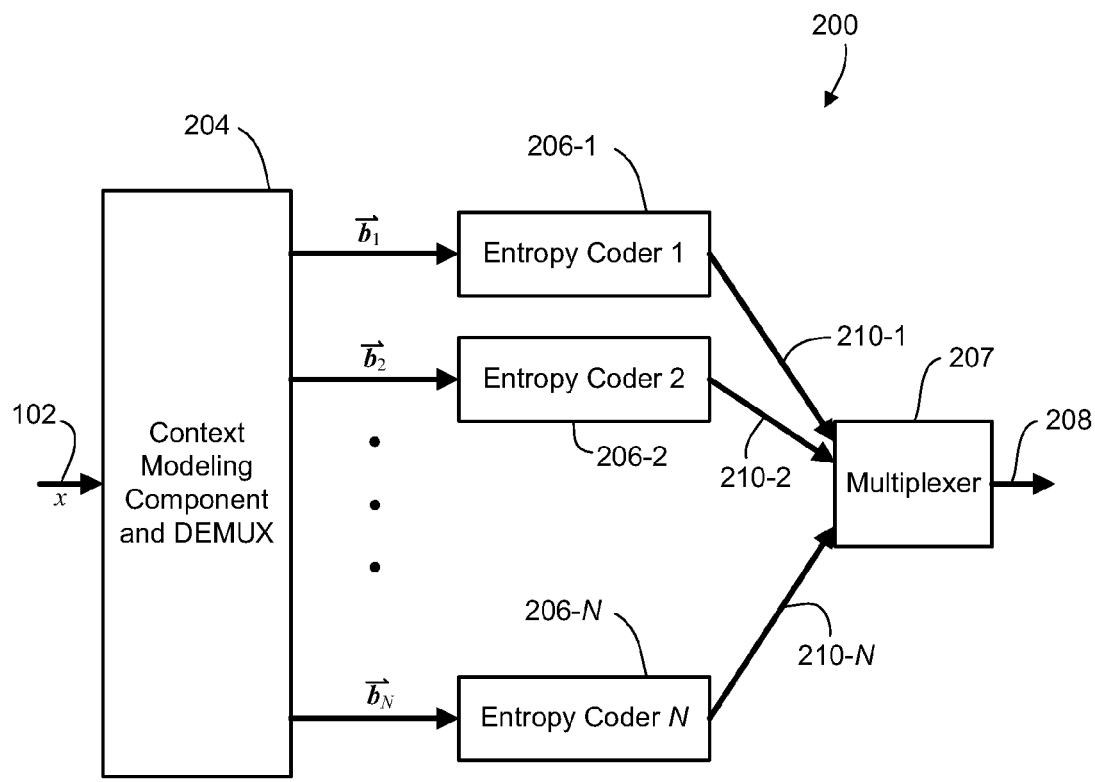
FIG. 4 shows, in block diagram form, an example encoder in accordance with an aspect of the present application.

Reference is now made to FIG. 4, which shows, in block diagram form, an example encoder 200. The encoder 200 receives an input sequence x 102, which in this example is a binary sequence. The encoder 200 outputs a bitstream 208 of encoded data.

The encoder 200 includes a context modeling component and demultiplexer 204. The context modeling component and demultiplexer 204 generate N subsequences $(b_1, b_2, \ldots, b_N)$ using a context model. In particular, for each bit of the input sequence x 102, its context is determined using the context model and, based on its context, an estimated probability is determined and associated with the bit. Each bit is then assigned to one of the N subsequences based on its associated estimated probability. In one example embodiment, there are N probabilities $p_i$ (i=0, 1, ..., N−1) defined by the context model and N subsequences; however, in some example embodiments there may be fewer subsequences than probabilities, meaning that bits associated with some probabilities may be assigned to the same subsequence. In some embodiments, there may be more subsequences that probabilities, meaning that some bits having the same associated probability may be split among two or more subsequences.

The N subsequences may be considered separate "sources". Accordingly, the terms "source" and "subsequence" may be used interchangeably herein. To the extent that the present application refers to a bit being "assigned" or "allocated" to a source, it indicates that the bit has been added to or appended to a subsequence associated with a particular probability estimation.

The context model may be static or may be adaptive. It will be understood that in the case of some sequences, in particular a binary sequence, an adaptive context model is likely to result in better performance than a static model.

The encoder 200 includes N parallel entropy coders 206 (individually labeled as 206-1, 206-2, ..., 206-N). Each entropy coder 206 encodes one of the subsequences to produce an encoded subsequence bitstream 210 (individually labeled as 210-1, 210-2, ..., 210-A). The encoded subsequence bitstreams 210 are then combined into a single bitstream 208 using, for example, a multiplexer 207. In this example, the encoded subsequence bitstreams 210 are multiplexed together to create the bitstream 208 by concatenating the subsequence bitstreams 210 and adding indexing information to the bitstream 208 to enable the decoder to identify the start of each encoded subsequence bitstream 210 in the single bitstream 208.

The entropy coders 206 may use any arbitrary entropy coding scheme for encoding the subsequences. In one example, the entropy coders may be order-0 lossless encoders. In a further example, the entropy coders 206 may employ a binary arithmetic coding scheme. In another example, the entropy coders 206 may employ a static k-bit Huffman code scheme. Yet other possibilities will be understood by those skilled in the art.

In yet further example embodiments, the entropy coders 206 may not all employ the same coding scheme. For example, one of the entropy coders 206 may use a static Huffman code, while another entropy coder 206 may use a binary arithmetic coding scheme. The entropy coders 206 are independent in this sense. In some instances, it might be desirable to encode certain subsequences associated with particular probabilities with one coding scheme, while encoding other subsequences associated with different probabilities with a different coding scheme.

Figure 5:
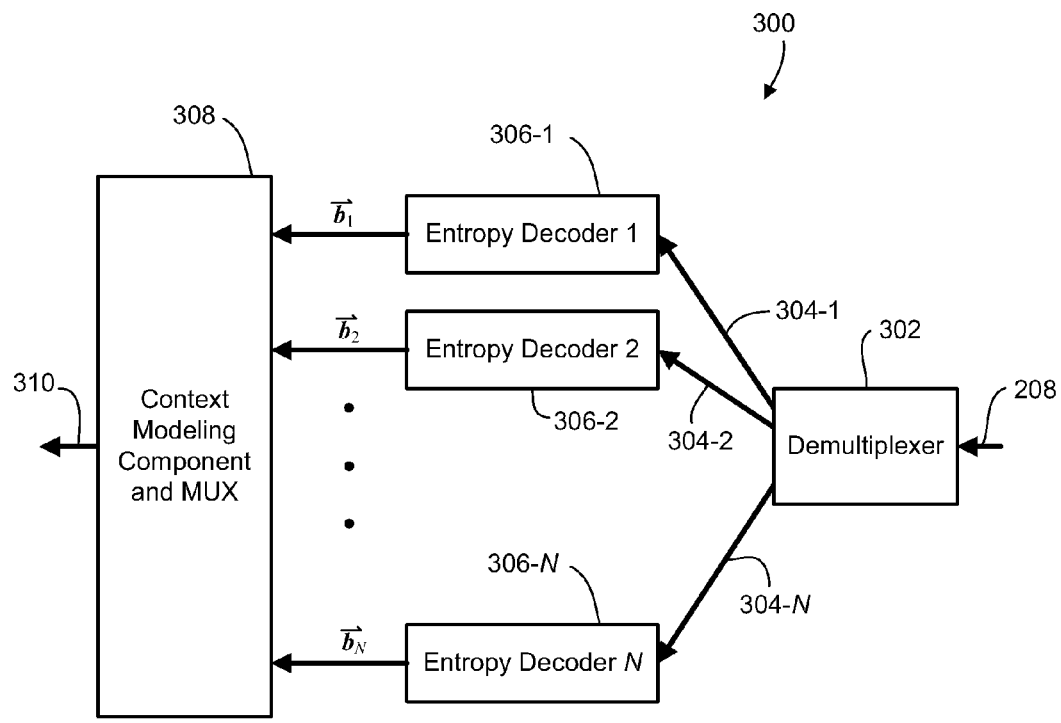
FIG. 5 shows, in block diagram form, an example decoder in accordance with an aspect of the present application.

Reference is now made to FIG. 5, which shows, in block diagram form, an example decoder 300. The decoder 300 receives the single bitstream 208 of encoded data and outputs a reconstructed sequence 310.

The decoder 300 includes a demultiplexer 302 for parsing the bitstream 208 extracting encoded subsequence bitstreams 304 (individually labeled as 304-1, 304-2, ..., 304-N). In an embodiment in which the bitstream 208 is formatted to include all the subsequence bitstreams 304 concatenated, then indexing within the bitstream 208 may be used by the demultiplexer 302 to identify the beginning and end locations of the subsequence bitstreams 304.

The decoder 300 further includes N entropy decoders 306 (individually labeled 306-1, 306-2, ..., 306-N). Each entropy decoder 306 receives one of the encoded subsequence bitstreams 304, and entropy decodes the encoded subsequence bitstream 304 to output the subsequence bitstream $b_i$, i=1, 2, ..., N. The N subsequence bitstreams from the N entropy decoders 306 are input to a context modeling component and multiplexer 308. The context modeling component and multiplexer 308 interleaves the symbols (bits) of the N subsequence bitstreams to generate the reconstructed sequence 310. The interleaving is based on a context model (the same context model used by the encoder 200), and using the context model to determine the estimated probability for a given context. Based on the estimated probability, the context modeling component and multiplexer 308 is able to identify which subsequence from which to select the next bit to add to the reconstructed sequence 310. On this basis, the reconstructed sequence 310 is created, matching the input sequence x 102.

Figure 6:
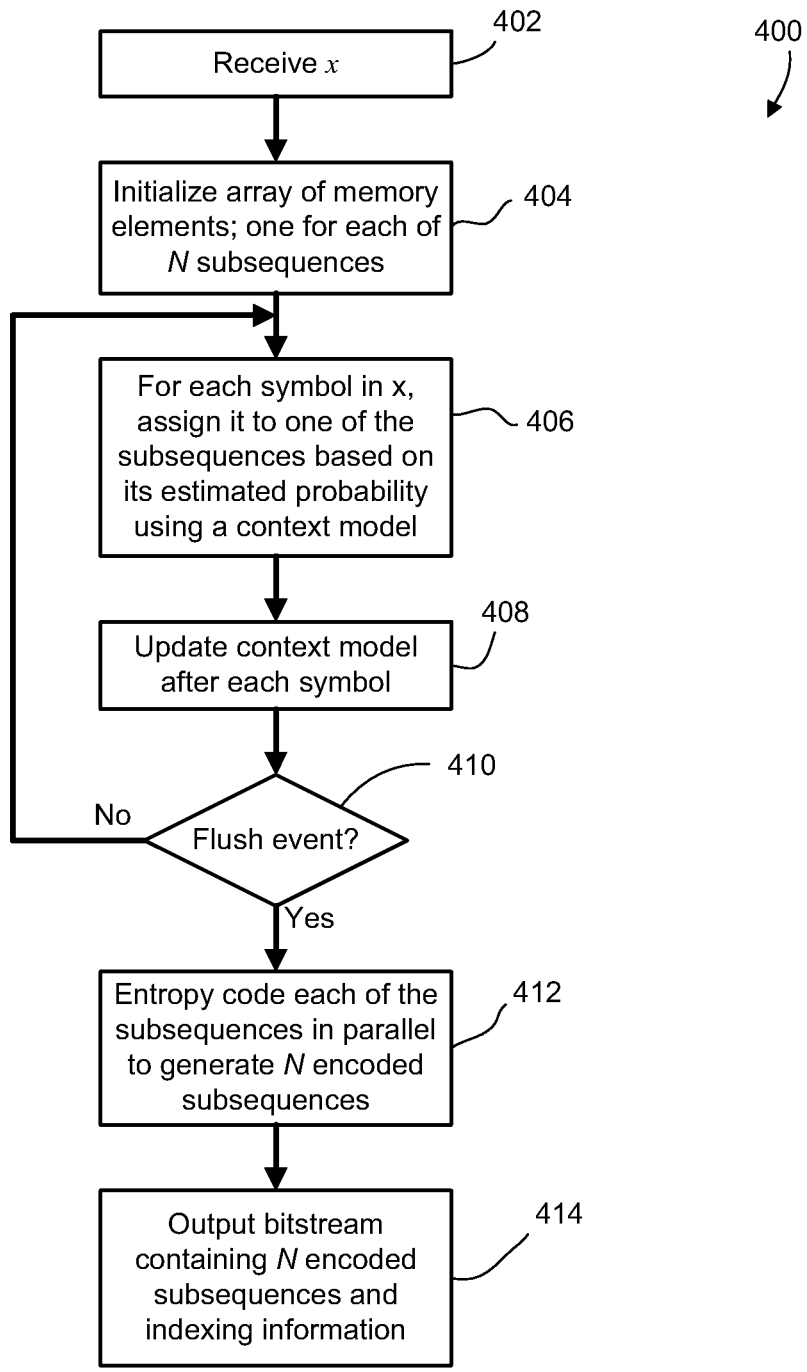
FIG. 6 shows, in flowchart form, an example method of encoding an input sequence of symbols using parallel entropy coders.

Reference is now made to FIG. 6, which shows, in flowchart form, an example method 400 of entropy encoding an input sequence x. The method 400 begins in step 402 with receipt of the input sequence x. The input sequence x is a binary sequence B=b1, b2, ... of binary symbols with probability estimates Pi(bi=0) and Pi(bi=1)=1−Pi(0). The probability estimates for the Least Probable Symbol (LPS) form a finite set:

$$S=\{P_k | 1 \le k \le N, 0 < P_k \le 0.5\}$$

The input sequence x may be considered as N sources outputting binary symbols using their respective probabilities in an arbitrary order.

In the example method 400, an array is initialized with N elements. The array may be an allocation of memory or registers having an element for each of the N sources, i.e. an element for collecting bits to build each of the N subsequences. In one embodiment each element may include two fields: a first field collecting symbols associated with its source, and a second field containing a pointer to the next element for the same source. When the first field is filled with bits, another element is added to the array for that source. In one embodiment, the first field is a 32-bit register for collecting symbols associated with the source.

Step 406 of the method 400 illustrates the context modeling and demuliplexing operation. In step 406, for each symbol (bit) of input sequence x, its context is determined, for example based on one or more previous bits in the input sequence x, and an estimated probability for the bit is determined based on its context and the context model. The bit is then assigned to one of the N sources based on its estimated probability. In other words, the bit is saved in the element corresponding to the source/subsequence associated with the estimated probability.

In step 408, after each symbol is processed in step 406 the context model may be updated, if the context model is adaptive.

Steps 406 and 408 repeat on a bit-by-bit basis to serially process the input sequence x, allocating its bits amongst the N subsequences based on their estimated probabilities. In step 410, if a flush event is detected, then the cycling of steps 406 and 408 end. A flush event may be any trigger event suitable to the application. For example, in video encoding, the flush event may be an end-of-frame, end-of-slice, or end of group-of-pictures (GOP). In image processing, the flush event may be an end-of-image. In one embodiment, the flush event may even be an end-of-macroblock. The flush event may also be based on a threshold or criteria being met by one or more of the subsequences. For example, if at least one subsequence exceeds the threshold number of symbols a flush event may occur. Other possible flush events will be appreciated by those ordinarily skilled in the art.

On occurrence of the flush event in step 410, the subsequences are supplied to their respective entropy coders where they are each entropy coded to produce respective encoded subsequences, as indicated in step 412. In one example embodiment, the entropy coders are configured to use static 8-bit Huffman coding to encode the subsequences. Other coding schemes, including binary arithmetic coding, may alternatively be used. A combination of coding schemes may also be used, for instance using a different coding scheme per subsequence. It will be appreciated that the entropy coding of the subsequences in step 412 occurs in parallel due to the parallel architecture of the entropy coders.

In step 414, a single bistream is constructed by multiplexing the N encoded subsequences. In this embodiment, the single bitstream is constructed by concatenating the encoded bitstreams in a payload portion of the bitstream in known order, and providing the bitstream with a prefix field containing indexing information for identifying the location of each of the encoded subsequences in the bitstream.

It will be appreciated that the steps 406, 408, 410, 412, and 414 may be repeated for multiple frames or slices in the case of encoding of a video, so as to generate a bitstream encoding multiple frames.

It will be appreciated that the encoded subsequences may be of different lengths when the flush event occurs. Accordingly, indexing information in the prefix field may be provided to pinpoint the location of each encoded subsequence in the payload portion of the bitstream. In some embodiments, the lengths may be encoded and placed in the prefix field. For example, the length of each encoded subsequence k in bytes may be given by L(k). The prefix code may be defined as:

If n<128, then C(n)=n<<1;

Else if n<16512, then C(n)=((n−128)<<2)|1;

Else if n<2113664, then C(n)=((n−16512)<<3)|3;

Else C(n)=((n−2113664)<<3)|7;

where "<<" is a right shift, and "|" is a bit-wise OR.

It will be appreciated that there may be an upper limit on "n", which in this case is L(k). The upper limit in any given embodiment may be dependent upon the implementation. The upper limit may be set by the maximum number of bytes that may be used for a given subsequence, or by the maximum number of bytes that can be used for specifying the length of the subsequence. In one instance, the limit on L(k) is that it must be represented within four bytes, meaning the size of L(k) is limited by about $2^{16}+2113664$.

Using the above-defined prefix code, the header portion of the output bitstream is given by C(L(k)). The above-defined structure of the prefix code ensures byte-alignment. It will be understood that the foregoing prefix code definition employs exponential golomb codes. It will be appreciated that other suitable coding schemes may be used for placing indexing information in the header, including, for example, Elias codes. In yet a further example, the indexing information is placed in the prefix without encoding.

At the decoder, the prefix codes are first decoded to identify the lengths of each of the subsequences. It will be understood that by knowing the lengths of the subsequences, the decoder is able to identify the start and end of each subsequence in the payload. The decoder is then able to parse the payload field to demuliplex the payload into individual encoded subsequences. In a different example embodiment, the indexing information in the header may specify the locations of the start bit of each subsequence, although the representation of the location information is likely to end up being larger than the length information and thus require a larger number of bits in the header.

Figure 7:
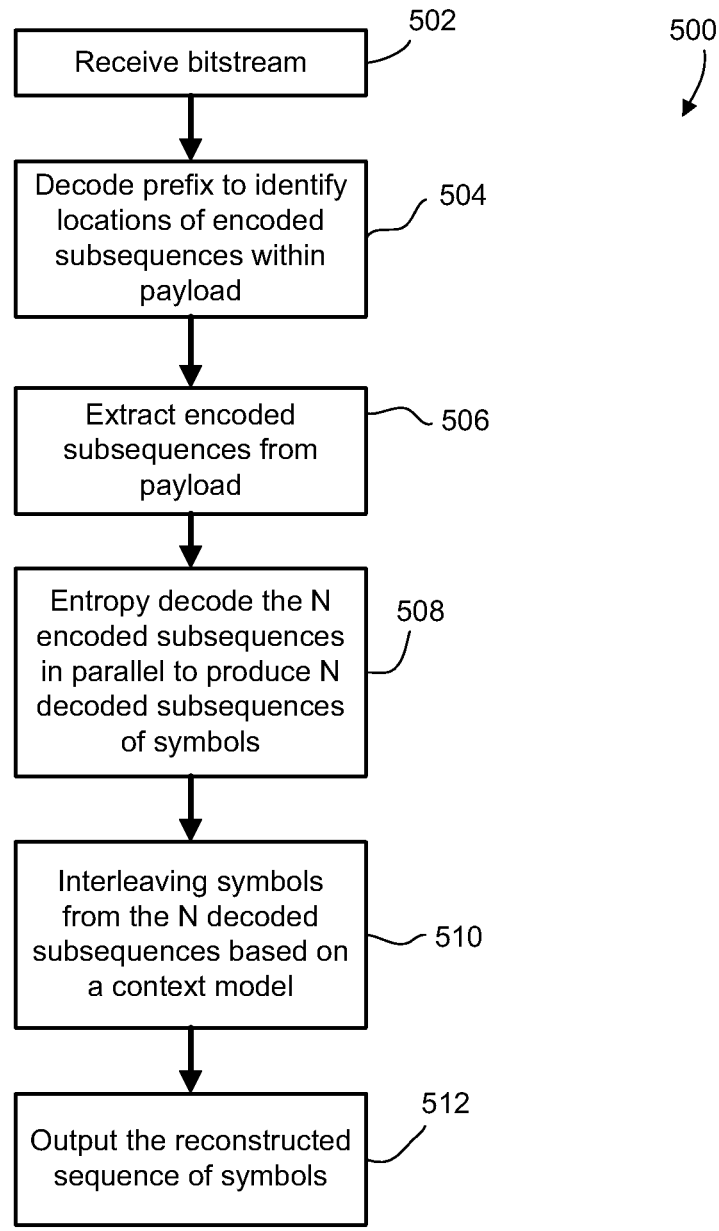
FIG. 7 shows, in flowchart form, an example method of decoding a bitstream of encoded data using parallel entropy decoders.

Reference is now made to FIG. 7, which shows, in flowchart form, a method 500 for decoding a bitstream of encoded data.

The method 500 includes receiving the bitstream of encoded data in step 502. In some instances, the bitstream may be read from a computer-readable storage medium, such as a compact disc (CD), digital video disc (DVD), Blu-ray disc, or the like. In some instances, the bitstream may be received through a communication link with one or more networks, perhaps including the Internet, over a wired or wireless connection.

In step 504, the decoder reads the prefix field of the bitstream to extract the indexing information. For example, in this embodiment, the decoder extracts the encoded length information L(k) for the N encoded subsequence bitstreams. On the basis of the extracted and decoded length information, the decoder identifies the location of the N encoded subsequence bitstreams in the payload portion of the bitstream. Accordingly, in step 506, the decoder extracts the encoded subsequences from the payload field of the bitstream.

In step 508, the encoded subsequences are entropy decoded in parallel by N parallel entropy decoders. Each of the entropy decoders receives one of the encoded subsequences, entropy decodes it, and outputs a decoded subsequence of symbols.

In step 510, the N decoded subsequences are interleaved to form a reconstructed sequence of symbols. The decoded subsequences are interleaved on the basis of a context model. In particular, the decoder determines, based on the context model, an estimated probability for each bit, and on the basis of the estimated probability it selects a symbol from the decoded subsequence associated with that estimated probability.

The reconstructed sequence of symbols is then output in step 512. It will be understood that step 512 may include providing the reconstructed sequence of symbols to the remaining portions of a video or image decoder, such as the de-quantization and inverse transform processes within such a decoder.

At step 506/508, in this embodiment, the decoder is able to determine the "source" associated with each encoded subsequence bitstream within the payload field on the basis that the "sources" are placed in the field in a predetermined order. In such an example embodiment, a source having no symbols outputs a NULL code at the encoder; or the encoder ensures the prefix specifies a "zero" length encoded subsequence for that source.

In another embodiment, the order is not predetermined. In one example, the encoder specifies the order and identifies the probabilities associated with each of the encoded subsequences, for example by placing such information in the prefix field. In yet another embodiment, the probability information may be placed within the payload field as a prefix or suffix to the encoded subsequence. In yet another example embodiment, an indexing scheme may be used for communicating the order of the subsequences, without sending explicit probabilities. For example, each coder/decoder may have an index and the subsequences may each have a header portion specifying its coder/decoder index, which allows the bitstream to avoid the header portion altogether. Other possibilities will be appreciated by those ordinarily skilled in the art.

In some instances, the number d of parallel encoding or decoding processing units, i.e. the number of parallel entropy coders 206 (FIG. 4) or decoders 306 (FIG. 5), may differ from the number N of distinct estimated probabilities. In one case, the decoder may have fewer parallel decoders 306 than there are N probabilities. The decoder may adopt scheduling so as to have one or more decoders process multiple subsequences, thereby reducing the parallelism to a degree. However, in one case the encoder, if it knows that the decoder has d<N decoders 306, may merge some of the sources/probabilities so that the number of subsequences generated by the encoder is no greater than d.

In another scenario, if the decoder has d>N decoders 306, then the encoder may split some sources/probabilities in order to maximize the use of the available parallel decoders 306.

In yet another scenario, the encoder does not know in advance how many parallel decoders 306 are available in the decoder. In this case, if the decoder has fewer parallel decoders 306 than the subsequences generated by the encoder, then the decoder cannot process all the subsequences in parallel and the decoder may schedule use of the decoders 306 amongst the subsequences.

For those instances where the number d of parallel decoding processing units differ from N, it would be advantageous to have a mechanism for combining source outputs (for d<N), or splitting source outputs (for d>N). For this example mechanism, the encoder knows the value d at the time of encoding. Nevertheless, if the decoder does not have d decoding units, lossless decoding is still achievable.

In this example let p be the LPS probability of source k. The overhead of output sequence k is seen to be $OH(k)=8*|C(L(k))|-4*\log(1-p)+4$, where $|C(v)|$ is the number of bytes representing value v using the prefix codes described above. If there is a source m with LPS probability q, for which $OH(k)>N(k)*[p*\log(p/q)+(1-p)\log((1-p)/(1-q))]$, where $N(k)$ is the number of binary symbols in the output of source k, then we merge the output of source k with that of source m, and use LPS=q for the merged sequence. This process can be repeated as long as $OH(k)/N(k)$ is greater than the relative entropy between some sources k and m.

Figure 8:
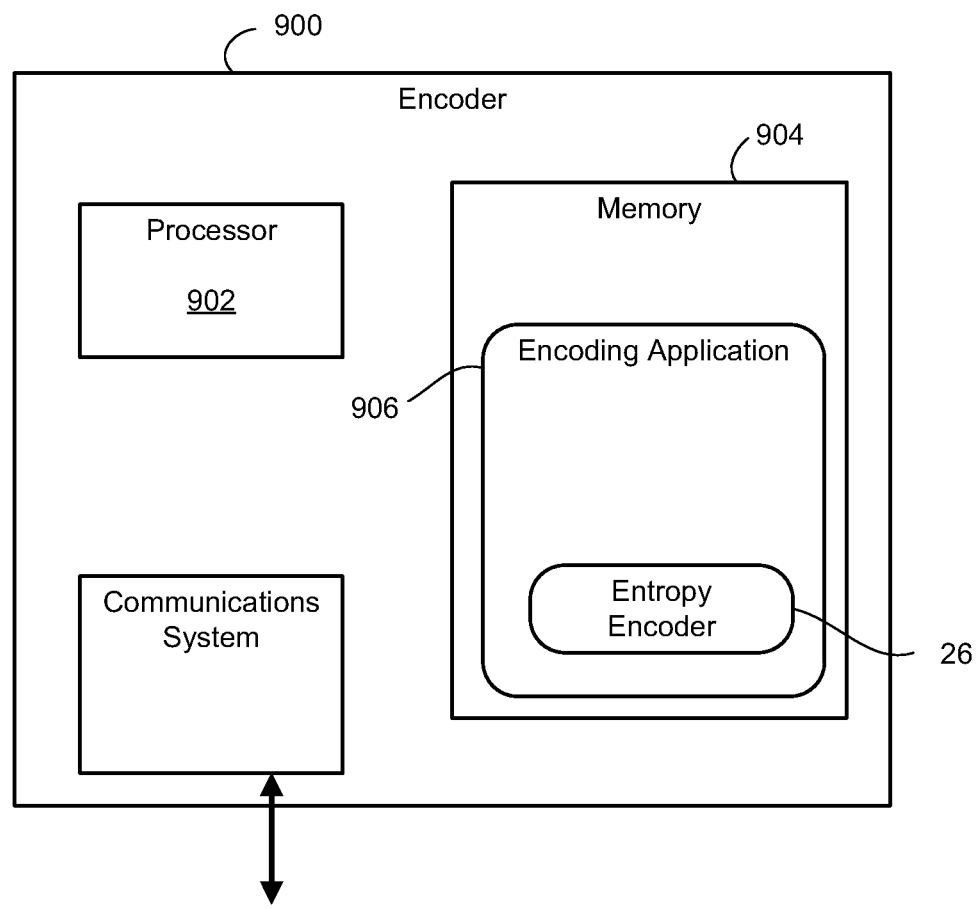
FIG. 8 shows a simplified block diagram of an example embodiment of an encoder.

Reference now made to FIG. 8, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output video bitstreams encoded in accordance with the parallel entropy encoding process described herein. The encoding application 906 may include an entropy encoder 26 configured to entropy encode input sequences and output a bitstream using one or more of the processes described herein. It will be understood that the encoding application 906 may be stored in on a computer readable medium, such as a compact disc, flash memory device, random access memory, hard drive, etc.

In some embodiments, the processor 902 in the encoder 900 may be a single processing unit configured to implement the instructions of the encoding application 906. In some other embodiments, the processor 902 may include more than one processing unit capable of executing instructions in parallel. The multiple processing units may be logically or physically separate processing units. In some instances, the encoder 900 may include N or more processing units, wherein N of the processing units are configured by the encoding application 906 to operate as parallel entropy coders for implementing the methods described herein. It will further be appreciated that in some instances, some or all operations of the encoding application 906 and one or more processing units may be implemented by way of application-specific integrated circuit (ASIC), etc.

Figure 9:
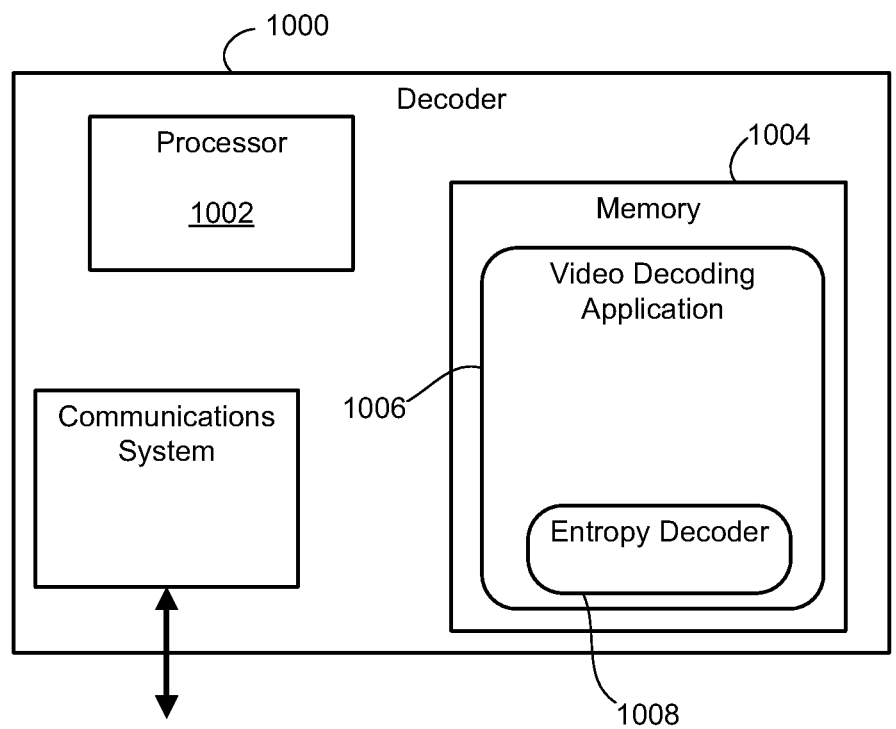
FIG. 9 shows a simplified block diagram of an example embodiment of a decoder.

Reference is now also made to FIG. 9, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include an entropy decoder 1008 configured to receive a bitstream encoded in accordance with the parallel entropy encoding process described herein, and to extract encoded subsequences from the bitstream and decode them in parallel. The decoding application 1006 may configure the processor to decode the encoded subsequences in parallel to produce parallel decode sequences and to interleave the symbols of the decode sequences to produce a reconstructed sequences, as described herein. It will be understood that the decoding application 1006 may be stored in on a computer readable medium, such as a compact disc, flash memory device, random access memory, hard drive, etc.

In some embodiments, the processor 1002 in the decoder 1000 may be a single processing unit configured to implement the instructions of the decoding application 1006. In some other embodiments, the processor 1002 may include more than one processing unit capable of executing instructions in parallel. The multiple processing units may be logically or physically separate processing units. In some instances, the decoder 1000 may include d, N or more or fewer processing units, wherein the processing units are configured by the decoding application 1006 to operate as parallel entropy decoders for implementing the methods described herein. It will further be appreciated that in some instances, some or all operations of the decoding application 1006 and one or more processing units may be implemented by way of application-specific integrated circuit (ASIC), etc.

Load Balancing

As described above, the parallel encoding of subsequences to generate an output bitstream results in a bitstream having a header portion and a payload portion. The payload portion contains concatenated encoded subsequences. The header portion details the lengths of those encoded subsequences. In some cases, the encoded subsequences may be byte-aligned, but not necessarily.

Figure 10:
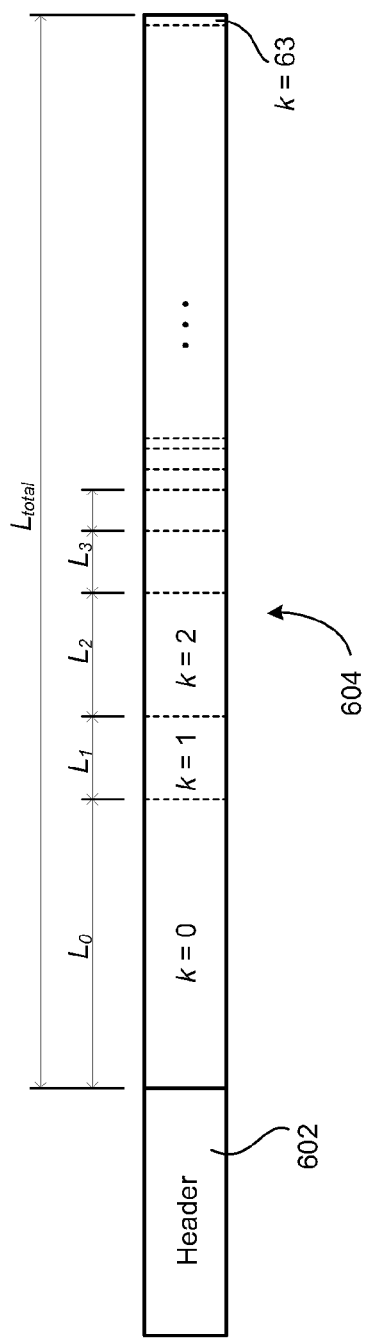
FIG. 10 shows an example bitstream.

Reference is now made to FIG. 10, which diagrammatically illustrates a bitstream 600. The bitstream 600 includes a header 602 and a payload 604. The payload 604 contains a plurality of encoded subsequences. There may be an encoded subsequence for each "source" or index, e.g. each value of k. In the case where there are 64 sources or indices, there may be up to 64 encoded subsequences. In the case of a less frequently occurring probability, there may be no bits associated with that probability, in which case there may be no encoded subsequence. In some cases a NULL value or other filler may be used in place of the encoded subsequence for that index. In the example shown in FIG. 10, the payload 602 shows encoded sequences for k=0, 1, 2, 3, . . . 63.

In many instances, the encoded subsequences will not be uniform in length. In fact, in many instances some of the encoded subsequences may be substantially longer than others. For example, the length $L_0$ of the encoded subsequence for k=0 or the length $L_1$ of the encoded subsequence for k=1 are both much greater than the lengths of the higher order indices, such the length $L_{63}$ of the encoded subsequence for k=63.

In one embodiment, in which there is a decoder for each index, i.e. there are N entropy decoders for N encoded subsequences, there may be an uneven computational burden placed on the parallel entropy decoders. For example, the entropy decoder assigned to process the encoded subsequence for k=0 will have a much greater computational burden than the other entropy decoders, and many of the entropy decoders assigned to process higher order indices will sit idle for a large portion of time. It will be appreciated that this is inefficient and undesirable.

It will also be appreciated that in many embodiments there will be fewer parallel entropy decoders than there are encoded subsequences. For example, if there are 64 indices, it is possible, but not very likely that a decoder would have 64 parallel entropy decoders. In many cases, the decoder will have fewer entropy decoders than there are encoded subsequences. Accordingly, in those circumstances, at least some of the entropy decoders process more than one of the encoded subsequences.

It would be advantageous to enable load balancing at the decoder so as to distribute the encoded sequences amongst the available parallel entropy decoders. In general, it would be advantageous to ensure each of the parallel entropy decoders bears a roughly equal share of the computational burden.

In accordance with one aspect of the present application, the payload is divided into segments of similar computational complexity, and the segments are distributed amongst the available entropy decoders.

In one embodiment, computational complexity may be assumed to correlate directly with the number of bits. In other words, the number of bits in a segment indicates the time or processing power required to entropy decode that segment. By dividing the payload into segments having an equal number of bits, then the payload is split into segments having equal computational burdens. These segments may then be allocated among the entropy decoders.

The foregoing assumption regarding the correlation between bit length and decoding complexity is fairly accurate in practice, but not perfect. In another embodiment, the computation complexity may be determined using a weighted measure of the number of bit, where each index has an assigned weight. The weights may reflect different complexity of that index's decoding tree, which may translate to different average decoding time. In this embodiment, the length of each encoded subsequence is multiplied by its assigned weighting factor $w_k$, and the products are summed to obtain a weighted bit length for the payload. This weighted bit length is then divided to find a weighted bit length of each segment. That weighted bit length is then applied to the encoded subsequences in accordance with their assigned weights to find the division points between the segments.

To illustrate these two examples of dividing the payload into segments, consider that the payload with N encoded subsequences has a length $L_{total}=L_0+L_1+ \ldots +L_{N-1}$. We may define a distributor function $F: \{0,1\}^K \rightarrow D(K, b)$, where D (K, b) is the set of all $(v_1, v_2, \ldots, v_b)$ vectors wherein $v_1 + v_2 + \ldots + v_b = K$. The distributor function partitions the concatenated encoded subsequences into b segments such that decoding of each of the segments takes approximately the same amount of time. The distributor function gives the length of the segments. We can also define an associated function $F'(x)$ that defines the starting positions of each of the segments. If $F(x) = (v_1, v_2, \ldots v_b)$, then $F'(x) = (0, v_0, v_1 + v_2, v_1 + v_2 + v_3, \ldots, v_1 + \ldots + v_b)$.

In the uniform distribution embodiment, in which the number of bits is assumed to correlate directly to decoding complexity, then $F(x) = (L_{total}/b, L_{total}/b, \ldots, L_{total}/b)$. The division may be rounded up or down to ensure the total sum of segments meets the bit length of the payload.

In the weighted distribution embodiment, we assume that the decoding complexity within each encoded subsequence is uniform, but that it can vary between encoded subsequences as reflected by their respective weighting factors $w_k$. The weighted bit length of the payload is given by $W = w_0 * L_0 + \ldots + w_{N-1} * L_{N-1}$. Suppose that we would like to divide the payload into b segments. Since each weighted bit correlates directly to decoding complexity, the weighted bit length of each segment is then given by $W/b$. Then the distribution function assigns the values $F'(x) = (v_1, v_2, \ldots v_b)$ such that for any $k < b$: the decoding complexity of a segment $x[v_k, \ldots v_{k+1}]$ is $W/b$.

Irrespective of how the payload is divided into segments, the divisions are unlikely to line up exactly with the boundaries of the encoded subsequences. This can mean that the segment for one entropy decoder ends with a first part of an encoded subsequence, and the remainder or second part of the encoded subsequence is the beginning of the segment for the next entropy decoder.

Figure 11:
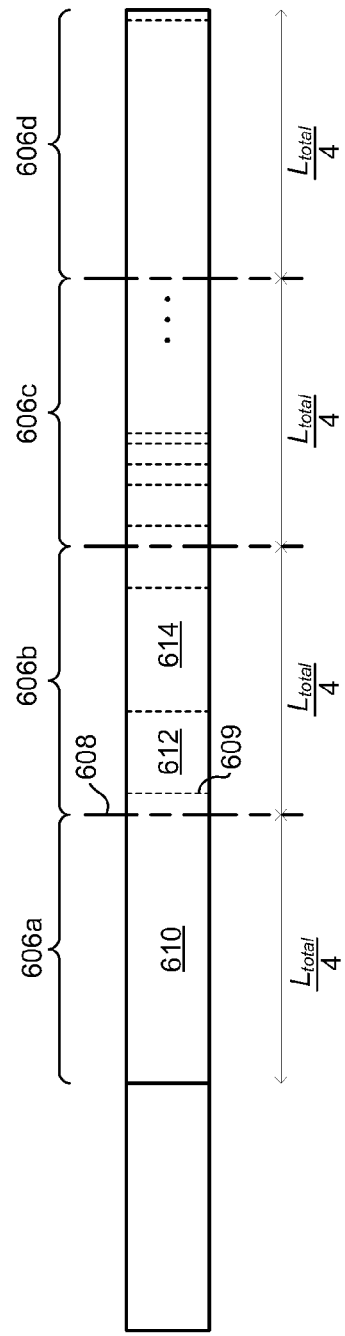
FIG. 11 shows the example bitstream of FIG. 10 in which the payload has been divided into segments.

FIG. 11 diagrammatically shows the example bitstream 600 from FIG. 10 divided into four segments 606 (shown individually as 606a, 606b, 606c, and 606d). In this example embodiment, uniform distribution has been assumed, such that each of the four segments is of a length $L_{total}/4$. The division into segments may be based on uniform distribution, weighted distribution, or any other distribution algorithm for dividing the payload into segments. In this non-limiting example illustration, the payload is divided into four segments. It will be noted that the segments do not necessarily begin or end at the beginning or end of an encoded subsequence. For example, a first division point 608 between the first segment 606a and the second segment 606b falls within the first encoded subsequence 610. The second segment 606b contains an end portion of the first encoded subsequence 610, the second encoded subsequence 612, and a first part of the third encoded subsequence 614.

In order to decode the segments in parallel, an entropy decoder assigned the second segment 606b begins entropy decoding the end portion of the first encoded subsequence 610 before another entropy decoder has decoded the first part of the first encoded subsequence 610. In order to enable this to occur, the present application defines a second header field containing auxiliary information. The second header field may, in some embodiments, follow the first header field. It may be located elsewhere in the bitstream in different embodiments employing different syntax, provided it can be accessed and read by the decoder.

It will be recalled that the first header field contains information regarding the length of or starting location of each the encoded subsequences in the payload. From this first header field, the decoder will know the length and location of each of the encoded subsequences. From this it may calculate the same division of the payload into segments as an encoder would have done, and thus can associate the auxiliary information in the second field with the appropriate segment.

The auxiliary information is information that the entropy decoder uses to enable it to begin decoding a second or end portion of an encoded subsequence before a first or beginning portion of the encoded subsequence has been decoded. The precise information is dependent on the entropy encoding algorithm. For example, different auxiliary information may be provided for a variable length coding (VLC) algorithm than for an arithmetic coding algorithm. The present application is not specific to any encoding algorithm and may be applicable to any encoding algorithm.

Figure 12:
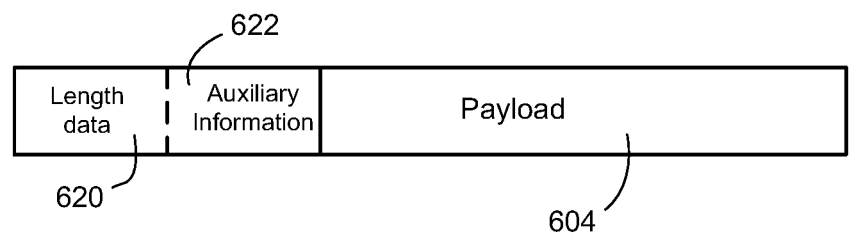
FIG. 12 shows an example bitstream having a header with first and second fields.

FIG. 12 shows the bitstream 600 with the header 602 containing the first header field 620 and a second header field 622. The first header field 620 contains length information, from which the decoder can identify the starting point within the payload 604 of each of the concatenated encoded subsequences. Knowing the start position of each of the encoded subsequences, the decoder is able to determine when to load a new decoding tree and for processing the bits of the encoded subsequence. The second header field 622 contains the auxiliary information that the decoder requires to begin parallel decoding of segments of the payload, where at least one of the segments begins with an end or second portion of one of the encoded subsequences.

Figure 13:
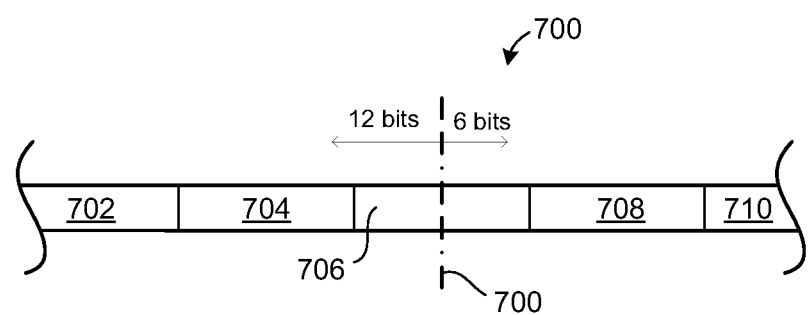
FIG. 13 diagrammatically shows a portion of an encoded subsequence split by a division into segments.

In one example implementation, useful with arbitrary variable length encoding such as Huffman coding or variable-to-variable (V2V) codes, the auxiliary information may include offset for adjusting the division point between segments that would otherwise apply based on the distributor function used at the encoder and decoder. Reference may be made to FIG. 13, which shows a portion of an encoded subsequence 700. The encoded subsequence is encoded using an arbitrary variable length encoding scheme, such that the resulting encoded subsequence is a series of codewords, shown individually as 702, 704, 706, 708, and 710. The decoding of the previous codeword is not necessary in order to decode any one of the codewords. However, the division of the payload into segments may result in splitting of a codeword, as illustrated by dividing line 720 splitting codeword 706. The dividing line 720 indicates the splitting point determined using an applicable distributor function for defining segment lengths.

In this example embodiment, the decoder requires knowledge of a nearby codeword boundary, such as the beginning of codeword 706 or the end of codeword 706. Accordingly, in one embodiment, the auxiliary information may be an offset defining the number of bits the division or splitting point should be moved in order to align with a codeword boundary. Because the encoder knows the location of the codeword boundaries, it can apply the same distributor function as will be used by the decoder to determine where the decoder will attempt to divide the payload into segments. It may then determine the appropriate offset to align the division with a codeword boundary and inserts the offset in the second field as auxiliary information.

The offset may, by convention, always indicate an offset to either the left or the right. In another embodiment, the offset may be signed to indicate whether the offset is to the left of the right. The offset field may be a predefined length, such as 4, 6 or 8 bits, the length of which will depend on the size of the codewords in the codeset.

In another example implementation, useful with arithmetic coding schemes, the auxiliary information may include state variables or values for initializing the entropy decoder to enable it to carry out decoding from the first bit in the end portion of the encoded subsequence. In other words, a set of variables $Z = (z_1, z_2, \ldots, z_s)$ are used in the applicable arithmetic decoder. The encoder performs decoding of the encoded subsequence up to the bit immediately preceding the division between segments. The state of Z (p) just after decoding the bit immediately preceding the division is written to the second field as auxiliary information. The decoder may then initialize the entropy decoder with the state of Z(p) in order to begin decoding the segment that begins with the end portion of that encoded subsequence. By way of example, in the H.264 standard JM/KTA implementation of CABAC, the state variables include (low, range, value, bits_to_go, buffer).

Figure 14:
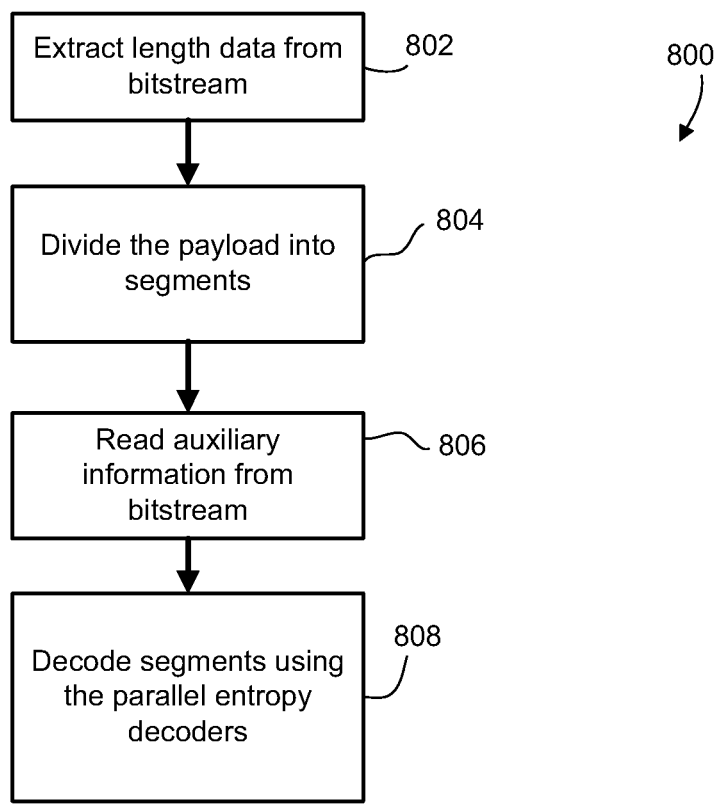
FIG. 14 shows, in flowchart form, a method of decoding a bitstream using parallel entropy decoders.

Reference will now be made to FIG. 14, which shows, in flowchart form, a method 800 of decoding a bitstream containing a payload of concatenated encoded subsequences using a decoder having two or more parallel entropy decoders.

The method 800 begins in with operation 802, in which the decoder extracts length data from the bitstream. As noted above, the length data may be found, in some embodiments, in a header portion of the bitstream. In some embodiments, the header includes a first header field containing the length data. The length data provide information regarding the length of each of the encoded subsequences, so that the decoder is capable of identifying the start point and end point of each of the concatenated encoded subsequences in the bitstream.

In operation 804, the decoder divides the payload into segments for parallel decoding. The decoder may divide the payload by calculating the division using a distributor function, such as one of the distributor functions described herein, for determining the bit lengths of the segments. In general, operation 804 aims to divide the payload into segments of approximately equal decoding computational complexity. In some embodiments, this may involve dividing the payload into segments having substantially equal bit lengths ("substantially" in this context refers to the fact that one or more of the segments may have one more bit or one less bit than some of the others if the number of segments does not divide into the total bit length of the payload evenly). In some embodiments, the division may be calculated using a weighted distributor function, such as that described above. In this case, the segments may not have substantially the same bit length.

The division of the payload into segments in operation 804 results in at least one encoded subsequence being divided between two segments. A first part of the encoded subsequence is within the end of one segment while the second part of the encoded subsequence appears at the beginning of the next segment.

In operation 806, the decoder obtains or reads auxiliary information from the bitstream. As detailed above, the auxiliary information is information that enables the decoder to begin entropy decoding the second part of the encoded subsequence without first entropy decoding the first part of the encoded subsequence. It will be appreciated that there may be auxiliary information for every division between segments.

The auxiliary information may be found by the decoder within the header. As described above, the header may have a second field that contains the auxiliary information.

The decoder then, in operation 808, decodes the segments using the parallel entropy decoders. As will be detailed further below, if the number of segments matches the number of entropy decoders, then each of the entropy decoders decodes one of the segments. If there are fewer segments than parallel entropy decoders, then one or more of the entropy decoders may be idle. If there are more segments than entropy decoders, then the decoder allocates the segments amongst the parallel entropy decoders. Further details of example processes for allocating the segments amongst the entropy decoders are described below.

The auxiliary information permits the entropy decoders to being decoding a segment that contains a second part of one of the encoded subsequences.

The entropy decoders produce decoded subsequences, the symbols from which the decoder can then interleave on the basis of a context model to generate an entropy decoded bitstream.

Figure 15:
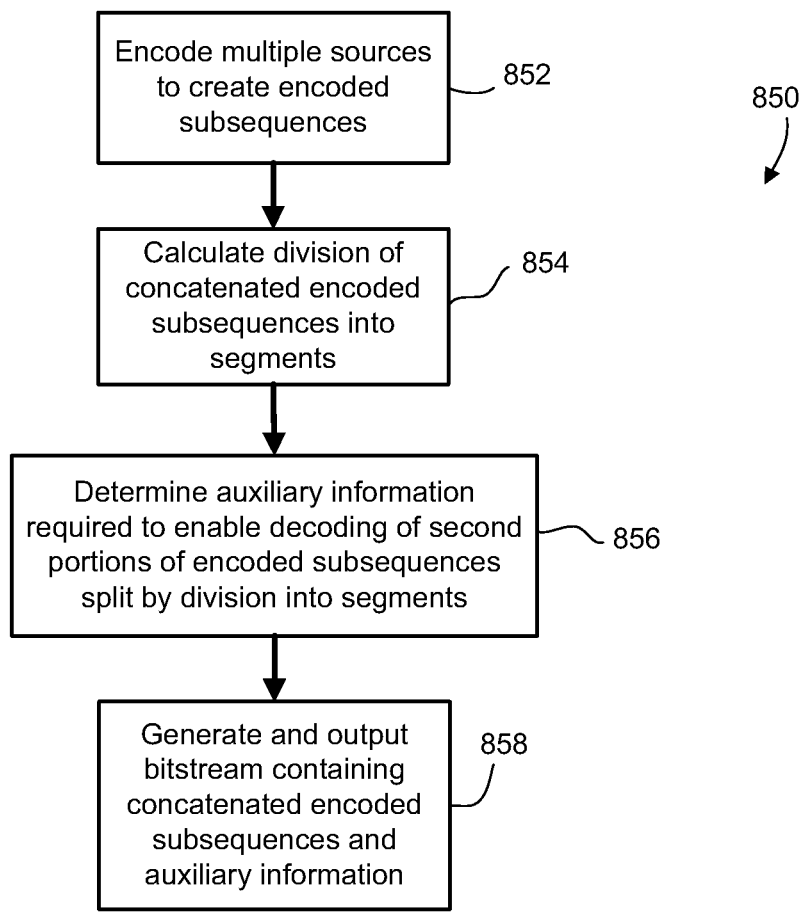
FIG. 15 shows, in flowchart form, a method of encoding multiple sources into a bitstream configured to be decoded by parallel entropy decoders.

Reference will now be made to FIG. 15, which shows, in flowchart form, a method 850 for encoding multiple sources to produce a bitstream having a payload of concatenated encoded subsequences configured to be decoded using two or more parallel entropy decoders. The encoder begins in step 852 with encoding the multiple sources to produce the encoded subsequences.

In step 854, the encoder calculates a division of the concatenated encoded subsequences into segments. As described above, the encoder may divide the concatenated encoded subsequences using a distributor function, such as one of the distributor functions described herein, for determining the bit lengths of the segments. The division will likely split at least one encoded subsequence into a first part and a second part located in adjacent segments.

In step 856, the encoder determines the auxiliary information required to enable decoding of the second parts or portions of the encoded subsequences that have been split by the division into segments. The type and nature of the auxiliary information is dependent upon the encoding scheme. In some instances the auxiliary information may include offset for shifting the points of division. In some instances the auxiliary information may include state variables for initializing an entropy decoder to enable it to begin decoding with the second part or portion. Other types or auxiliary information specific to particular encoding schemes are also contemplated.

The encoder then, in step 858, outputs the bitstream, where the bitstream includes a payload containing the concatenated encoded subsequences, and includes the auxiliary information determined in step 856. In some embodiments, the bitstream includes a header and the header includes a first field containing length data for the encoded subsequences, and a second field containing the auxiliary information. The output bitstream may be transmitted over a wired or wireless communications network or other communications path, or it may be stored locally on a computer-readable storage medium, such as a compact disc, DVD, HD-DVD, Blu-Ray™ disc, hard drive, ROM, flash memory, etc.

As noted above, the encoder and decoder may be configured to apply a distributor function to divide the payload into b segments. The decoder may be equipped with d parallel entropy decoders. In the general case b may not be the same as d.

The most simple embodiment is where the encoder knows d and can select b to match d; however, in many instances the encoder may be encoding the content for a plurality of decoder, some of which may be equipped with parallel entropy decoders, some of which may not, and different decoders may have a different number d of parallel entropy decoders. The encoder in many cases will not know how many parallel entropy decoders will be available at the decoder.

In general it would be desirable to set b=d. In general it is also undesirable to set b<d, since one or more of the parallel entropy decoders may sit idle during the decoding process.

Accordingly, in accordance with one aspect of the present application, the encoder selects b such that it is likely to be greater than d, but not so large as to impose a heavy bit rate overhead on the bitstream by requiring too much auxiliary information. If b>d then the decoder can allocate the b segments amongst the d decoders so as to best balance the load.

In general it would also be desirable to have b/d be an integer, since the b segments may then be equally allocated amongst the d parallel entropy decoders.

In many cases, a parallel architecture tends to be established using powers of two. In other words, a decoder having parallel entropy decoders is likely to have 2, 4, 8, 16, etc. parallel entropy decoders. Therefore, to take advantage of this likelihood and to minimize the chance that of a unequal allocation of segments to decoders, the number of segments b could be set to a power of 2 sufficiently large to accommodate most architectures, but sufficiently small to avoid excessive overhead in the auxiliary information field. In other words, in some embodiments, the number of segments, b, is set to $2^r$.

In another embodiment, the number of segments b may be set to a least common multiple of the likely number of entropy decoder. For example, it might be assumed that the number of parallel entropy decoders is likely to be a member of the set [1, 2, 3, 4, 6, 8, 12]. The least common multiple of these is 24, so the encoder and decoder may be configured to use 24 segments. Other variations will be appreciated by those ordinarily skilled in the art having regard to the foregoing discussion.

It will be appreciated that the decoder and/or encoder according to the present application may be implemented in a number of computing devices, including, without limitation, servers, suitably programmed general purpose computers, set-top television boxes, television broadcast equipment, and mobile devices. The decoder or encoder may be implemented by way of software containing instructions for configuring a processor to carry out the functions described herein. The software instructions may be stored on any suitable computer-readable memory, including CDs, RAM, ROM, Flash memory, etc.

It will be understood that the encoder and decoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method of decoding a bitstream at a decoder, the bitstream including concatenated encoded subsequences, wherein each of the encoded subsequences is associated with a respective estimated probability defined by a context model, the method comprising:
partitioning the concatenated encoded subsequences into a plurality of segments, wherein the partitioning divides at least one of the encoded subsequences into a first part within one of the plurality of segments and a second part within another of the plurality of segments;
extracting auxiliary information from the bitstream; and
decoding the plurality of segments, wherein the auxiliary information enables decoding of the second part without first decoding the first part.

2. The method claimed in claim 1, wherein the decoder decodes at least two of the plurality of segments in parallel.

3. The method claimed in claim 1, wherein the encoded subsequences contain codewords, and wherein the auxiliary information comprises an offset value for modifying the partitioning that divides the at least one of the encoded subsequences based on the offset value.

4. The method claimed in claim 3, wherein the offset value is a number of bits, and wherein the method comprises modifying the partitioning that divides the at least one of the encoded subsequences by the number of bits so as to align the partitioning that divides the at least one of the encoded subsequences with a codeword boundary.

5. The method claimed in claim 1, wherein the encoded subsequences have been encoded using an arithmetic encoding scheme, and wherein the auxiliary information comprises state variables for initializing the decoder to enable it to decode the second part of the at least one of the encoded subsequences.

6. The method claimed in claim 1, wherein the partitioning divides the payload into the plurality of segments and the auxiliary information comprises auxiliary information for each division between segments.

7. The method claimed in claim 1, further comprising extracting, from the bitstream, data indicating the length of the encoded subsequences.

8. The method claimed in claim 1, wherein partitioning includes dividing the payload into the plurality of segments such that no segment has a length longer than any other by more than one bit.

9. The method claimed in claim 1, wherein partitioning includes calculating a weighted distribution function in which each encoded subsequence has an associated weighting factor and the weighted distribution function includes multiplying the bit length of each encoded subsequence by its associated weighting factor and summing the weighted bit lengths of all the encoded subsequences.

10. The method claimed in claim 1, wherein the decoder includes two or more entropy decoders.

11. The method claimed in claim 10, wherein there are more segments than entropy decoders, the method further comprising distributing the segments amongst the entropy decoders for the decoding.

12. The method claimed in claim 11, wherein the number of segments is an integer multiple of the number of entropy decoders, and wherein distributing includes distributing the integer number of segments to each entropy decoder.

13. A decoder for decoding a bitstream, the bitstream including concatenated encoded subsequences, wherein each of the encoded subsequences is associated with a respective estimated probability defined by a context model, the decoder comprising:
a processor;
a memory; and
a decoding application stored in memory and containing instructions for configuring the processor to:
partition the concatenated encoded subsequences into a plurality of segments, wherein the partitioning divides at least one of the encoded subsequences into a first part within one of the plurality of segments and a second part within another of the plurality of segments;

extract auxiliary information from the bitstream; and decode the plurality of segments, wherein the auxiliary information enables decoding of the second part without first decoding the first part.

14. The decoder claimed in claim 13, wherein the decoder decodes at least two of the plurality of segments in parallel.

15. The decoder claimed in claim 14, wherein the decoder includes at least two or more entropy decoders.

16. The method claimed in claim 15, wherein there are more segments than entropy decoders, and where the processor is configured to distribute the segments amongst the entropy decoders for the decoding.

17. The method claimed in claim 16, wherein the number of segments is an integer multiple of the number of entropy decoders, and wherein the processor is configured to distribute the integer number of segments to each entropy decoder.

18. The decoder claimed in claim 13, wherein the encoded subsequences contain codewords, and wherein the auxiliary information comprises an offset value for modifying the partitioning that divides the at least one of the encoded subsequences based on the offset value.

19. The decoder claimed in claim 13, wherein the encoded subsequences have been encoded using an arithmetic encoding scheme, and wherein the auxiliary information comprises state variables for initializing the decoder to enable it to decode the second part of the at least one of the encoded subsequences.

20. A computer-readable medium having stored thereon computer-executable instructions which, when executed by a processor, configure the processor to execute the method claimed in claim 1.

* * * * *